(12) United States Patent
Zhang et al.

(10) Patent No.: US 10,201,082 B2
(45) Date of Patent: Feb. 5, 2019

(54) TRANSPARENT CONDUCTIVE LAYER, A FILM COMPRISING THE LAYER, AND A PROCESS FOR ITS PRODUCTION

(71) Applicant: BASF SE, Ludwigshafen (DE)

(72) Inventors: Rui Zhang, West New York, NJ (US); Garo Khanarian, Princeton, NJ (US); Herve Dietsch, Bad Duerkheim (DE); Andreas Kuehner, Darmstadt (DE)

(73) Assignee: BASF SE, Ludwigshafen (DE)

( * ) Notice: Subject to any disclaimer, the term of this patent is extended or adjusted under 35 U.S.C. 154(b) by 0 days.

(21) Appl. No.: 15/513,066

(22) PCT Filed: Sep. 17, 2015

(86) PCT No.: PCT/EP2015/071350
§ 371 (c)(1),
(2) Date: Mar. 21, 2017

(87) PCT Pub. No.: WO2016/046061
PCT Pub. Date: Mar. 31, 2016

(65) Prior Publication Data
US 2017/0251553 A1  Aug. 31, 2017

Related U.S. Application Data

(60) Provisional application No. 62/053,272, filed on Sep. 22, 2014.

(51) Int. Cl.
| | |
|---|---|
| *B32B 3/02* | (2006.01) |
| *H05K 1/09* | (2006.01) |
| *C09D 11/52* | (2014.01) |
| *H05K 3/02* | (2006.01) |
| *G02F 1/1343* | (2006.01) |
| *C09D 11/037* | (2014.01) |
| *C09D 11/10* | (2014.01) |
| *H05K 1/03* | (2006.01) |
| *B82Y 30/00* | (2011.01) |

(52) U.S. Cl.
CPC .......... *H05K 1/097* (2013.01); *C09D 11/037* (2013.01); *C09D 11/10* (2013.01); *C09D 11/52* (2013.01); *G02F 1/13439* (2013.01); *H05K 1/032* (2013.01); *H05K 1/0306* (2013.01); *H05K 3/027* (2013.01); *B82Y 30/00* (2013.01); *G02F 2202/36* (2013.01); *H05K 2201/0323* (2013.01); *H05K 2201/09681* (2013.01); *H05K 2203/0392* (2013.01); *H05K 2203/107* (2013.01)

(58) Field of Classification Search
CPC ...... H05K 1/032; H05K 1/097; H05K 1/0306; H05K 3/027
See application file for complete search history.

(56) References Cited

U.S. PATENT DOCUMENTS

| | | | |
|---|---|---|---|
| 6,300,594 B1 | 10/2001 | Kinoshita et al. | |
| 8,018,568 B2 | 9/2011 | Allemand et al. | |
| 2007/0074316 A1 | 3/2007 | Alden et al. | |
| 2008/0283799 A1 | 11/2008 | Alden et al. | |
| 2008/0286447 A1 | 11/2008 | Alden et al. | |
| 2009/0291302 A1 | 11/2009 | Shimotsuma et al. | |
| 2011/0285019 A1 | 11/2011 | Alden et al. | |
| 2013/0319729 A1 | 12/2013 | Poon | |
| 2013/0323411 A1 | 12/2013 | Poon | |
| 2013/0323478 A1 | 12/2013 | Poon | |
| 2013/0323482 A1 | 12/2013 | Poon | |
| 2014/0120027 A1 | 5/2014 | Tanabe et al. | |
| 2014/0230967 A1 | 8/2014 | Dittli et al. | |
| 2014/0332254 A1* | 11/2014 | Pellerite | G02F 1/13439 174/251 |
| 2015/0010695 A1 | 1/2015 | Poon | |
| 2015/0047885 A1* | 2/2015 | Chang | G06F 3/044 174/257 |
| 2015/0144380 A1* | 5/2015 | Yang | H05K 1/097 174/253 |
| 2015/0209897 A1* | 7/2015 | Fried | B82Y 30/00 219/121.85 |
| 2016/0073494 A1* | 3/2016 | Uchida | H01L 51/0021 345/173 |

FOREIGN PATENT DOCUMENTS

| | | |
|---|---|---|
| EP | 0 938 135 A2 | 8/1999 |
| JP | 2009-94033 A | 4/2009 |
| WO | WO 2007/022226 A2 | 2/2007 |
| WO | WO 2013/095971 A1 | 6/2013 |

OTHER PUBLICATIONS

International Search Report dated Jan. 12, 2016 in PCT/EP2015/071350.
International Preliminary Report on Patentability and Written Opinion dated Jan. 11, 2017 in PCT/EP2015/071350.
Ralf Hellmann, et al., "Laser patterning of transparent electrode films: from solar panels through high-end displays", http://www.industrial-lasers.com/articles/2011/11/laser-patterning-of-transparent-electrode-films-from-solar-panels-through-high-end-displays.html,XP002692111, Nov. 10, 2011, pp. 1-6.
Joshua A. Spechler, et al., "Direct-write pulsed laser processed silver nanowire networks for transparent conducting electrodes", Applied Physics A: Materials Science & Processing, XP002692113, vol. 108, No. 1, Jul. 2012, pp. 25-28.

* cited by examiner

*Primary Examiner* — Elizabeth E Mulvaney
(74) *Attorney, Agent, or Firm* — Oblon, McClelland, Maier & Neustadt, L.L.P.

(57) ABSTRACT

The invention relates to a transparent conductive layer comprising non-conductive areas and conductive areas, wherein the conductive areas comprise an interconnected network of electrically conductive nanoobjects and in the non-conductive areas the nanoobjects are converted into particles and wherein the thickness of the conductive areas and the non-conductive areas differs less than 10 nm. The invention further relates to a process for producing a patterned transparent conductive film, the film comprising a substrate and a transparent conductive layer, and to a process for producing the patterned transparent conductive film.

18 Claims, 3 Drawing Sheets

Figure 1:
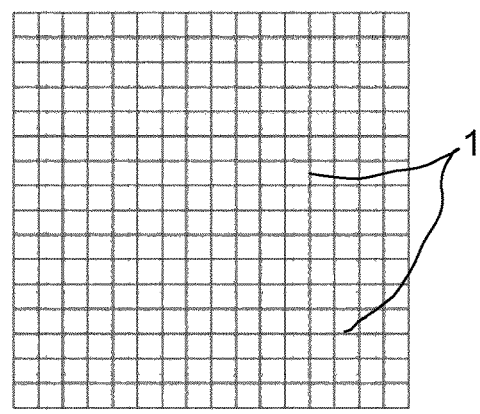

TRANSPARENT CONDUCTIVE LAYER, A FILM COMPRISING THE LAYER, AND A PROCESS FOR ITS PRODUCTION

The present invention relates to a transparent conductive layer comprising non-conductive areas and conductive areas. The invention further relates to a patterned transparent conducting film comprising the layer and a process for producing such a film.

Patterned transparent conductive films comprising a transparent conductive layer are used for example in flat liquid crystal displays, touch panels, electroluminescent devices, thin film photovoltaic cells, as anti-static layers, and as electromagnetic wave shielding layers.

The transparent conductive layers generally are composites, comprising an optically transparent contiguous solid phase and a conductive network of electroconductive nanoobjects which extend throughout the solid phase. The solid phase, also referred to as matrix, is formed of one ore more optically transparent polymers. The matrix binds the electroconductive nanoobjects within the layer, fills the voids between the electroconductive nanoobjects, provides mechanical integrity and stability to the layer and binds the layer to the surface of the substrate. The conductive network of electroconductive nanoobjects allows for flow of an electric current between adjacent and overlapping electroconductive nanoobjects within the layer. Due to the small dimensions of the nanoobjects, their influence on the optical behavior of the composite is quite small thus allowing for the formation of an optically transparent composite, i.e. a composite having a light transmission of 80% or more in the visible region (400 to 700 nm) measured according to ASTM D 1003.

A transparent conductive layer and a process for its production are disclosed for example in WO-A 2013/095971. For producing a transparent electrically conductor an electrically conductive layer is disposed onto a transparent substrate. The electrically conductive layer comprises a plurality of interconnecting metallic nanowires and a polymeric overcoat layer. In the electrically conductive layer a pattern is formed, wherein the pattern comprises electrically conductive areas which are separated by electrically insulating traces. The traces are produced by irradiation with a laser, wherein material of the electrically conductive layer is removed. Therefore, the traces are formed as valleys in the electrically conductive layer. The valleys have a depth in the range from 10 to 100 nm and a cross-sectional width in the range from 10 to 1000 µm. The valleys further comprise a plurality of crevices having a depth in the range from 50 to 100 nm.

Further transparent conductive layers comprising a polymer matrix and conductive nanowires are disclosed in US-A 2007/0074316 or U.S. Pat. No. 8,018,568. In the conductive areas the nanowires interconnect. The non-conductive areas are formed by etching or photo-patterning by using photo-curable matrix materials.

However, etching the non-conductive areas has the disadvantage that multistep wet chemistry has to be used. Further, as well as in photo-patterning, the pattern may be visible. A disadvantage of the process as disclosed in WO-A 2013/095971 is that metal of the nanowires is vaporized and re-deposited on the edges of the spots irradiated by the laser, forming highly reflective dots or circles of tens of microns sizes. Therefore, there may be significant changes in haze, transparency and reflectance in the irradiated regions which means that the pattern also may be visible.

A further disadvantage of all known processes is that it is not possible to produce a smooth surface due to the production processes.

Therefore, it is an object of the present invention to provide a transparent conductive layer in which the pattern is not visible and which further has a smooth surface. It is a further object of the present invention to provide a patterned transparent film and a process for producing such a transparent conductive film.

This object is achieved by a transparent conductive layer comprising non-conductive areas and conductive areas, wherein the conductive areas comprise an interconnected network of electrically conductive nanoobjects and in the non-conductive areas the nanoobjects are converted into particles and wherein the thickness of the conductive areas and the non-conductive areas differs less than 10 nm.

In regard to the present invention the term "particles" means spheres or short segments of the nanowires into which the nanowires have been converted.

The invention further relates to a patterned transparent conductive film, comprising a substrate and the conductive layer on the substrate.

To achieve a transparent conductive film, the substrate onto which the ink is applied is optically transparent. The substrate preferably is made of glass, polycarbonate, polyethylene terephthalate, cyclic olefin polymer, polyimide, or polymethyl methacrylate.

In accordance with the present invention, the nanoobjects which have been converted into particles in the non-conductive areas remain in the layer, wherein the particles generated during conversion remain at the same position at which the nanowires have been. This has the advantage that it is not necessary to remove material from those parts of the transparent conductive layer which form the non-conductive areas. Therefore, the optical characteristics of the conductive areas and the non-conductive areas are similar to a large extend.

The conductive areas and the non-conductive areas are defined by their sheet resistance. The sheet resistance is a measure of resistance of a sheet namely uniform in thickness. The term "sheet resistance" implies that the current flow is along the plane of the sheet, not perpendicular to it. For a sheet having a thickness t, a length L and a width W, the resistance R is $$R = \rho \cdot \frac{L}{W \cdot t} = \frac{\rho}{t} \cdot \frac{L}{W} = R_{sh} \cdot \frac{L}{W}$$

wherein $R_{sh}$ is the sheet resistance. Accordingly the sheet resistance $R_{sh}$ is $$R_{sh} = R \cdot \frac{W}{L}.$$

In the formula given above, the bulk resistance R is multiplied with a dimensionless quantity (W/L) to obtain the sheet resistance $R_{sh}$, thus the unit of sheet resistance is Ohm. For the sake of avoiding confusion with the bulk resistance R, the value of the sheet resistance is commonly indicated as "Ohm per Square" because in the specific case of a square sheet applies W=L and $R_{sh}$=R. The sheet resistance is measured for example by means of a four point probe.

In a preferred embodiment, the ratio of sheet resistance in the non-conductive areas and the conductive areas is larger than 1000. In a particular preferred embodiment, the ratio of sheet resistance in the non-conductive areas and the conductive areas is larger than 10000. The sheet resistance of the non-conductive areas preferably is larger than 100,000 ohms per square (OPS), more preferred larger than 1,000,000 OPS, and particularly larger than 10,000,000 OPS. The sheet resistance of the conductive areas preferably is smaller than 1000 OPS, more preferred in the range from 5 to 500 OPS, and particularly in the range from 10 to 100 OPS.

In a preferred embodiment, the difference in light transmission of the non-conductive areas and the conductive areas is less than 5%. Particularly preferred, the difference in light transmission of the non-conductive areas and the conductive areas is less than 0.5%. The light transmission refers to the percentage of an incident light which is transmitted through a medium. The light transmission of the conductive areas according to the invention is at least 80%, measured according to ASTM D 1003 (Procedure A). More preferred, the light transmission is at least 85%, further preferably at least 90% and particularly preferably at least 95%, in each case measured according to ASTM D 1003 (Procedure A).

The difference in haze of the non-conductive areas and the conductive areas preferably is less than 0.5%. Particularly preferred the difference in haze is less than 0.01%. The haze of the conductive areas of the transparent conductive layer is preferably 2% or less, more preferably 1.8% or less, further preferably 1.5% or less and particularly preferably 1.2%, in each case measured according to ASTM D 1003 (Procedure A).

The measurement of haze and light transmission (in ASTM D 1003 referred to as luminous transmittance which is the ratio of the luminous flux transmitted by a body to the flux incident upon it) by means of a hazemeter is defined in ASTM D 1003 as "Procedure A—Hazemeter". The values of haze and light transmission (corresponding to the luminous transmittance as defined in ASTM D 1003) given in the context of the present invention refer to this procedure.

Generally haze is an index of the light diffusion. It refers to the percentage of the quantity of light separated from the incident light and scattered during transmission. It is typically caused by surface roughness, and by embedded particles or compositional heterogeneities in the medium.

According to ASTM D 1003, in transmission, haze is the scattering of light by a specimen responsible for the reduction in contrast of objects viewed through said specimen, i.e. the percent of transmitted light that is scattered so that its direction deviates more than a specified angle) (2.5°) from the direction of the incident beam.

A nanoobject in regard to the present invention is an object having one, two, or three external dimensions in the nanoscale, i.e. in the size range from approximately 1 nm to 100 nm. The electrically conductive nanoobjects to be used for the present invention are electrically conductive nanoobjects having two external dimensions in the range from 1 nm to 100 nm and their third external dimension in the range from 1 µm to 100 µm. Typically, said two external dimensions which are in the range from 1 nm to 100 nm are similar, i.e. they differ in size by less than three times. The third dimension of the electrically conductive nanoobjects is significantly larger, i.e. it differs from the other two external dimensions by more than three times. Such nanoobjects also are referred to as nanofibers.

The electrically conductive nanoobjects used in the present invention are preferably nanowires or nanotubes. Nanowires are electrically conductive nanofibers, nanotubes are hollow nanofibers.

Electrically conductive nanoobjects used for the present invention typically have a cross section close to circular shape. Said cross section extends perpendicularly to said external dimension which is in the range of from 1 µm to 100 µm. Thus, said two external dimensions which are in the nanoscale are defied by the diameter of said circular cross section. Said third external dimension extending perpendicular to said diameter is referred to as the length.

Preferably, the electrically conductive nanoobjects have a length in the range from 1 µm to 100 µm, more preferably from 3 µm to 50 µm, and particularly preferably from 10 µm to 50 µm. The diameter of the electrically conductive nanoobjects preferably is in the range from 1 nm to 100 nm, more preferably from 2 nm to 50 nm, particularly preferably from 3 nm to 30 nm.

To provide a sufficient electrical conductivity, the electrically conductive nanoobjects are made of a metal or carbon. Preferably, the electrically conductive nanoobjects are made of silver, copper, gold, platinum, palladium, nickel or carbon. In case the electrically conductive nanoobjects are made of a metal, preferably silver, copper, gold, platinum, palladium or nickel, the nanoobjects preferably are nanowires. In case the electrically conductive nanoobjects are made of carbon, the nanoobjects preferably are nanotubes. Particularly preferably, the nanoobjects are silver nanowires, gold nanowires or copper nanowires, particularly silver nanowires.

In the conductive areas of the transparent conductive layer, the nanoobjects are interconnected. The amount of nanoobjects is such that the interconnecting nanoobjects are in contact. Due to the contact of the nanoobjects, electric current can flow in the conductive areas. On the other hand, in the non-conductive areas the nanoobjects are converted into particles. The particles are not in contact with each other and therefore, no electric current can flow. The particles, into which the nanoobjects have been converted, have a cross section which corresponds to the cross section of the nanoparticles. The diameter of the cross section of the particles is in the range from 1 to 100 nm, preferably in the range from 2 to 50 nm. The length of the particles is in the range from 1 nm to 1 µm, preferably in the range from 2 nm to 500 nm.

To provide a transparent conductive layer, the nanoobjects are embedded in a transparent matrix. Matrix materials are generally transparent polymers, for example hydropropyl methyl cellulose, crystalline cellulose, poly(meth)acrylates, copolymers of acrylates and methacrylates, copolyers of styrene and (meth)acrylates, carboxymethyl cellulose, poly acrylamide, polyvinylalcohol, polyvinylpyrrolidone, polystyrenesulfonic acid, dextran or blends thereof.

The further object of the invention is achieved by a process for producing a patterned transparent conductive film, comprising:
(a) applying of an ink comprising electrically conductive nanoobjects and a binder on a substrate, forming a layer;
(b) drying the layer;
(c) patterning the layer by irradiating with a laser, the pattern comprising conductive areas and non-conductive areas, wherein in the non-conductive areas the conductive nanoobjects are converted into particles.

The ink, which is applied on the substrate, comprises electrically conductive nanoobjects as described above, a binder and generally additionally a solvent.

Suitable electrically conductive nanoobjects are known in the art and are commercially available.

Nanowires made of metals, for example silver nanowires, are typically commercially available in the form of an aqueous dispersion wherein polyvinylpyrrolidone is adsorbed onto the surface of the nanowires in order to render the dispersion stable. Any matter adsorbed on the surface of the nanowires is not included in the above-defined dimensions and composition of the electrically conductive nanoobjects.

The binder which is comprised in the ink forms the matrix of the transparent conductive layer by drying. To provide an ink, which can be applied to the substrate, the solvent is selected such that the binder is soluble in the solvent. As the nanowires are not soluble, the nanowires are dispersed in the solvent comprising the solved binder. The binder corresponds to the matrix material of the transparent conductive layer as defined above and is preferably selected from the group consisting of hydropropyl methyl cellulose, crystalline cellulose, poly(meth)acrylates, copolymers of acrylates and methacrylates, copolyers of styrene and (meth)acrylates, carboxymethyl cellulose, poly acrylamide, polyvinylalcohol, polyvinylpyrrolidone, polystyrenesulfonic acid, dextran or blends thereof.

In case the binder is a poly(meth)acrylate, a copolymer comprising (meth)acrylate, for example a copolymer of acrylate and methacrylate, or a copolymer of styrene and (met)acrylate, the solvent preferably is water. Herein, the term "(meth)acrylate" includes "acrylate" and "methacrylate".

However, if polymers are used as binder which are not soluble in water, the solvent preferably is an organic solvent. Preferably, the solvent is selected from the group consisting of water, alcohols, ketones, ethers, hydrocarbons or aromatic solvents. Suitable aromatic solvents are for example benzene, toluene ore xylene. Particularly preferred, however, the binder is selected from polymers which are water soluble and the solvent is water.

The ink which is applied to the substrate preferably comprises 0.01 to 1 wt %, preferably 0.05 to 0.5 wt % electrically conductive nanoobjects, 0.02 to 5 wt %, preferably 0.1 to 1.5 wt % binder and solvent.

As an alternative or additionally, the ink comprises a binder which is dispersed in the solvent. In this case the binder is in form of particles of a polymer having a number average molecular weight of 25000 g/mol or higher. The dispersed particles have a mean diameter in the range from 10 nm to 1000 nm.

In a further alternative embodiment, the binder comprises fibers of crystalline cellulose dispersed in water. The fibers of crystalline cellulose have a length in the range from 80 nm to 300 nm and a diameter in the range from 5 nm to 30 nm.

Besides poly(meth)acrylate, a copolymer comprising (meth)acrylate, for example a copolymer of acrylate and methacrylate, or a copolymer of styrene and (met)acrylate, the binder may comprise as an alternative or additionally one or more water-soluble polymers selected from the group consisting of hydroxypropyl methyl cellulose, carboxymethyl cellulose, polyacrylamide, polyvinylalcohol, polyvinylpyrrolidone, polystyrenesulfonic acid and dextran.

Each of the above identified binders can be used as a single binder or in combination with at least one further binder. For example a mixture of poly(meth)acrylate or a (meth)acrylate comprising copolymer and crystalline cellulose can be used.

A suitable ink is disclosed for example in U.S. application No. 62/037,630 and U.S. application No. 62/037,635.

To apply the ink onto the substrate, any suitable printing process can be used. In a preferred embodiment, the ink comprising conductive nanowires and binder is applied by spin coating, draw down coating, roll-to-roll coating, gravure printing, microgravure printing, screen-printing, flexoprinting and slot-die coating.

Preferably, the ink is applied to the surface of the substrate in a thickness in a range of from 1 µm to 200 µm, preferably of from 2 µm to 60 µm. The thickness is also referred to as "wet thickness" and relates to the state before removing the liquid constituents of the ink by drying. At a given target thickness (after removing the liquid constituents of the composition as explained above) and accordingly a given target sheet resistance and light transmission of the electroconductive layer to be prepared, the wet thickness may be the higher the lower the concentration of solid constituents in the composition is in the ink. The process of applying the ink is facilitated when there is no need to use a particular low wet thickness.

After applying the ink to the substrate, the layer which is formed by applying the ink is dried to remove solvent and to achieve a solid layer. The solid layer which is formed from the ink by drying preferably has a thickness in the range from 10 nm to 1000 nm, preferably from 50 nm to 500 nm.

The drying of the layer preferably is carried out at a temperature in the range from 20 to 200° C. for 0.5 to 30 min. Particularly preferably the drying is carried out at a temperature in the range from 100 to 150° C. The duration of the drying process particularly preferably is in the range from 1 to 15 min.

The temperature at which the drying process is carried out depends on the solvent used, the melting point of the nanowires and the coating process. For silver nanowires, the upper limit is about 200° C. If a solvent is used which evaporates easily, a lower temperature, for example ambient temperature, can be used. On the other hand, a higher temperature for drying the layer has to be used in case the solvent does not evaporate at low temperatures or only a small amount of the solvent evaporates. To accelerate the drying process, the drying preferably is carried out at higher temperatures of at least 100° C. However, when the ink is applied to the substrate by roll-to-roll coating such as gravure printing, flexoprinting and slot-die coating, the drying of layers may be carried out in ambient conditions.

The duration of the drying process depends on the drying temperature. The duration is selected such that at the end of the drying process the residual moisture content in the ink is below a defined value. To achieve the desired residual moisture content, the duration of evaporation increases with decreasing temperature for the same solvent.

In case water is used as a solvent, generally the drying is carried out at a temperature in the range from 100 to 150° C. for a duration of 1 to 15 min.

The atmosphere in which the drying is carried out is preferably selected such that no chemical reaction takes place between any component of the atmosphere and the ink. The atmosphere in which the drying of the layer is carried out preferably comprises air, nitrogen or noble gases, for example argon. Particular preference is given to air or nitrogen.

After applying the ink and drying of the layer, a pattern of conductive areas and non-conductive areas is formed in the layer by irradiation with a laser. The operating conditions of the laser are selected such that the electrically conductive nanoobjects are converted into particles and that as little as possible material of the layer evaporates. By this operating conditions the material of the layer remains in the layer and the differences in thickness, light transmission and haze between conductive areas and non-conductive areas are as small as possible.

The laser which is used to convert the electrically conductive nanoobjects can be any laser which allows the conversion of the nanoobjects into particles. Suitable lasers are for example IR laser or UV laser. Preferably, the laser which is used in the process is a fiber laser. The laser can be operated in pulsed mode or continuous wave mode.

The pattern comprises non-conductive lines and conductive areas which are surrounded by the non-conductive lines. The width of the non-conductive lines preferably is in the range from 10 to 1000 µm, particularly in the range from 50 to 500 µm.

By forming the non-conductive areas by irradiation with a laser in such a form that the electrically conductive nanoobjects are converted into particles and remain in the conductive transparent layer, the differences in thickness between the non-conductive areas and the conductive areas are in the range from 1 to 10 nm, particularly in a range from 2 to 5 nm. Due to the small differences in thickness of the conductive areas and the non-conductive areas, a smooth surface of the conductive transparent layer can be achieved. This smooth surface also helps in invisible patterning and any subsequent processes that require planarization.

The differences in haze and light transmission of the conductive transparent layer and the patterned conductive transparent film which is produced by the above process are as described above.

The invention is hereinafter further illustrated by means of examples. Results additionally are shown in the figures.

Figure 2A:
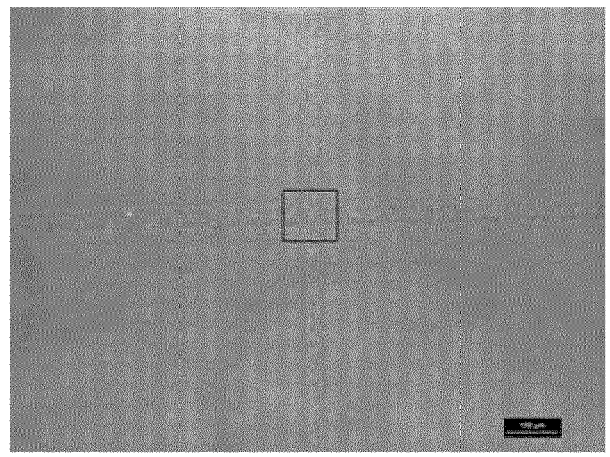
Figure 2B:
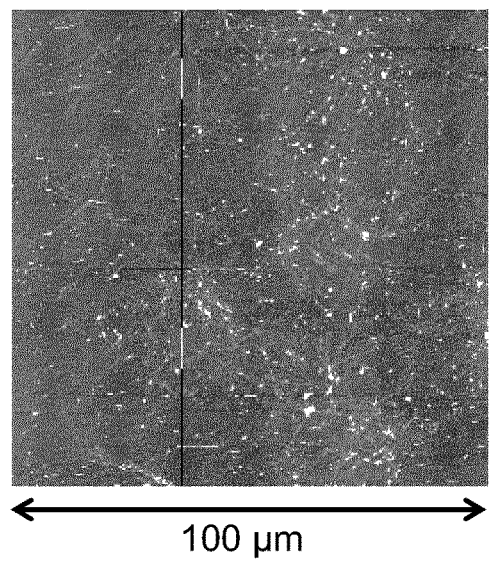
Figure 2C:
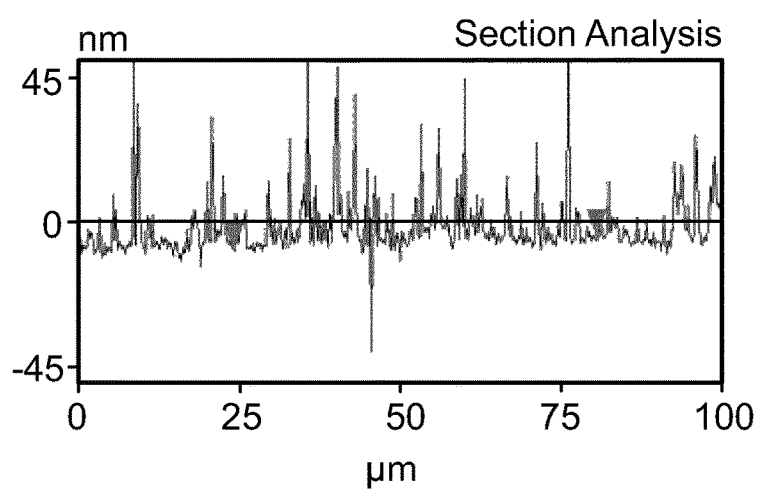
Figure 3:
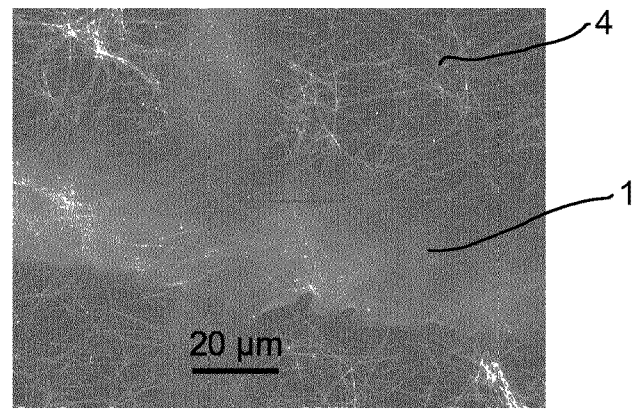
Figure 4:
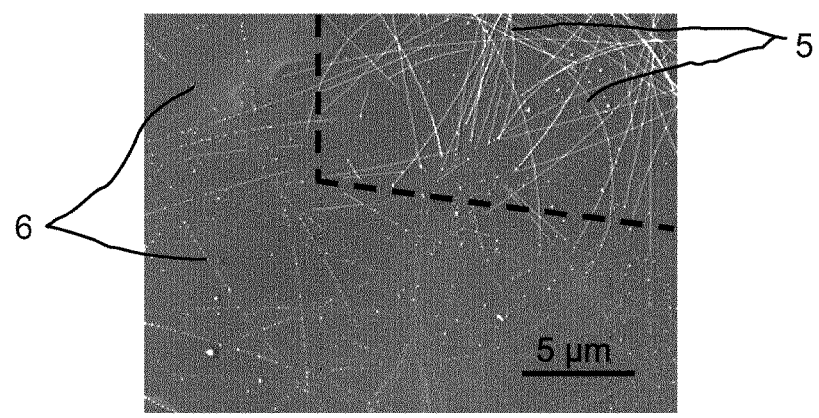

In the figures:
FIG. 1 shows a grid pattern;
FIG. 2(a) shows an optical image with a rectangle indicating AFM scanned area;
FIG. 2(b) shows an AFM height image at 100 µm×100 µm;
FIG. 2(c) shows AFM profile analysis.
FIG. 3 shows a SEM image of a laser treated silver nanowire layer;
FIG. 4 shows a detail of the laser treated silver nanowire layer of FIG. 3.

EXAMPLES

Example 1: Preparation of Silver Nanowire Layers on Glass Substrates

Hydropropyl methyl cellulose is dissolved in water at a concentration of 1 wt %. The dissolved hydropropyl methyl cellulose and a dispersion of silver nanowires in water (0.5 wt %) are mixed in water so that the final concentration of silver nanowires is 0.25 wt % and the mass ratio of hydropropyl methyl cellulose and silver nanowires is 1:2, respectively. Nanowires are obtainable for example from Seashell Technologies (San Diego, Calif.). The mixture is spin coated on glass substrates at 2000 rpm for 30 sec. The layers are then dried at 130° C. for 5 min. The sheet resistance is measured by a 4 point probe station (Lucas lab pro-4) and the optical properties are measured by BYK haze gard plus.

Example 2: Preparation of Silver Nanowire Layers on Polycarbonate Substrates

A styrene acrylic copolymer aqueous solution with 35% solid content, available as Joncryl® 60 by BASF SE, is diluted in water to a concentration of 20 wt %. A copolymer of 2-ethylhexyl acrylate methyl methacrylate, available as Acronal® LR9014 by BASF SE is diluted in water to a concentration of 10 wt %. A dispersion of silver nanowires in water (0.4 wt %), the diluted styrene acrylic copolymer aqueous solution and the diluted copolymer of 2-ethylhexyl acrylate methyl methacrylate are mixed in water so that the final concentration of the silver nanowires is 0.4 wt % and the mass ratio of styrene acrylic copolymer, copolymer of 2-ethylhexyl acrylate methyl methacrylate and silver nanowires is 4:3:3, respectively. The mixture is ball milled for 3 min to achieve homogenization. A conductive layer is printed on an optical polycarbonate foil, for example commercially available under the product specification Makrofol® DE 1-1 175 µm from Bayer Material Science, using a draw-down bar (wet thickness t=6 µm, coating speed v=2"/sec) was dried for 5 min at 135° C. Sheet resistance and optical properties are measured as in Example 1.

Example 3: Laser Patterning of Silver Nanowire Layers on Glass—Grid Pattern

A silver nanowire layer prepared according to example 1 is patterned by laser according to a grid pattern as shown in FIG. 1. The laser is a Rofin® model F20 operating at I=1070 nm, pulse repetition rate 60 kHz, and laser power 3 W. The width of the focused beam on the substrate was about 30 µm. The distance between adjacent lines is 1.5 mm. The laser was scanned across the substrate at a speed of about 600 mm/sec. The patterned layer is examined under scanning electron microscope (SEM). The SEM images are shown in FIGS. 3 and 4, wherein FIG. 4 shows the detail which is marked by the rectangle in FIG. 3.

The laser traces 1 are roughly 30 µm wide. The silver nanowires 5 in the non-treated regions 4 are intact while those in the laser traces 1 are converted to silver particles 6. The particles 6 have similar diameters to the silver nanowires 5 and they stay where the nanowires were before the laser treatment.

FIG. 2(a) shows an optical image with a rectangle indicating a 100 µm×100 µm AFM scanned area. FIGS. 2(b) and 2(c) show the AFM height image and profile analysis, wherein FIG. 2(b) shows the detail which is marked by a rectangle in FIG. 2(a). The red triangles in FIGS. 2(b) and 2(c) indicate the two locations where the height of the film was measured. As can be seen in FIG. 2(c), the thickness of the conductive areas and the non-conductive areas differs by 3.8 nm.

Example 4: Optical Property Change of Silver Nanowire Layers on Glass after Laser Treatment In order to measure the optical property change after laser treatment, silver nanowire layers on 25 cm-by-25 cm size are prepared according to example 1 on glass and the entire surface is processed by laser. An Infrared fiber laser is used. The incident laser energy is varied by using different laser power, pulse repetition rate and velocity. After laser treatment, the sheet resistance is measured as in example 1. The results are shown in tables 1.1 and 1.2.

TABLE 1.1

| Sample # | Laser power (W) | Pulse repetition rate (Hz) | Velocity (mm/s) | $R_{sh}$ before (OPS) | $R_{sh}$ after (OPS) |
|---|---|---|---|---|---|
| 1 | 3 | 90k | 600 | 84 ± 3 | ~1000 |
| 2 | 3 | 80k | 600 | 77 ± 3 | ∞ |
| 3 | 3 | 70k | 600 | 81 ± 1 | ∞ |
| 4 | 3 | 50k | 600 | 74 ± 5 | ∞ |
| 5 | 3 | 90k | 550 | 81 ± 1 | ∞ |
| 6 | 3.2 | 90k | 600 | 77 ± 6 | ∞ |

TABLE 1.2

| Sample # | T before (%) | T after (%) | ΔT % | H before (%) | H after (%) | ΔH |
|---|---|---|---|---|---|---|
| 1 | 92.1 | 91.7 | 0.4 | 0.75 | 0.75 | ~0 |
| 2 | 92.0 | 91.5 | 0.5 | 1.04 | 1.03 | 0.01 |
| 3 | 92.1 | 91.3 | 0.8 | 0.83 | 0.85 | 0.02 |
| 4 | 92.0 | 89.4 | 0.6 | 0.84 | 0.96 | 0.12 |
| 5 | 92.1 | 91.6 | 0.5 | 0.83 | 0.82 | 0.01 |
| 6 | 92.1 | 91.6 | 0.5 | 0.87 | 0.90 | 0.03 |

Samples 1 through 4 are treated with the same laser power and velocity but different pulse repetition rate. Lower pulse repetition rate leads to higher incident laser energy. Sample 1 shows a sheet resistance ($R_{sh}$) of about 1000 OPS indicating the incident laser energy is too low to break down the percolating network completely. Samples 2 and 3 show a sheet resistance which exceeded the measurement range and was too high to be measured. The optical properties change very little after the laser treatment, satisfying the requirements. The incident laser energy for sample 4 is higher. As a result, the transmission T and the haze H change is also higher (2.6% and 0.12%, respectively).

Samples 5 and 6 are treated with the same pulse repetition rate as sample 1 but with different velocity and laser power, respectively. Lower velocity or higher laser power leads to higher incident laser energy. Therefore, both sample 5 and 6 have higher incident laser energy than sample 1. Both samples show no conductance and the optical properties change very little after the laser treatment, satisfying the requirements.

Example 5: Optical Property Change of Silver Nanowire Layers on Polycarbonate After Laser Treatment A sheet of silver nanowire layer on polycarbonate is prepared according to example 2. In order to measure the optical property change after laser treatment, a piece of 25 cm-by-25 cm size is cut and the entire surface of this piece is processed by the laser. After laser treatment, the sheet resistance is measured as in example 1. Results are shown in Tables 2.1 and 2.2.

TABLE 2.1

| Sample # | Laser power (W) | Pulse repetition rate (Hz) | Velocity (mm/s) | Rsh before (OPS) | Rsh after (OPS) |
|---|---|---|---|---|---|
| 7 | 2 | 100k | 2000 | 58 ± 3 | ∞ |

TABLE 2.2

| Sample # | T before (%) | T after (%) | ΔT % | H before (%) | H after (%) | ΔH % |
|---|---|---|---|---|---|---|
| 7 | 90.3 | 89.4 | 0.9 | 1.16 | 1.14 | 0.02 |

At this incident laser energy, sample 7 shows no conductance and and optical properties change very little after the laser treatment, satisfying the requirements.

The invention claimed is:

1. A transparent conductive layer, comprising:
    non-conductive areas and conductive areas,
    wherein the conductive areas comprise an interconnected network of electrically conductive nanoobjects and in the non-conductive areas the nanoobjects are converted into particles, and
    wherein the thickness of the conductive areas and the non-conductive areas differs less than 10 nm.

2. The transparent conductive layer according to claim 1, wherein the ratio of sheet resistance in the non-conductive areas and the conductive areas is larger than 1000.

3. The transparent conductive layer according to claim 1, wherein the difference in light transmission of the non-conductive areas and the conductive areas is less than 5%.

4. The transparent conductive layer according to claim 1, wherein the difference in haze of the non-conductive areas and the conductive areas is less than 0.5%.

5. The transparent conductive layer according to claim 1, wherein the electrically conductive nanoobjects are nanowires or nanotubes.

6. The transparent conductive layer according to claim 1, wherein the electrically conductive nanoobjects are made of silver, copper, gold, platinum, palladium, nickel or carbon.

7. The transparent conductive layer according to claim 1, wherein the electrically conductive nanoobjects have a diameter in the range from 1 to 100 nm and a length in the range from 1 to 100 µm.

8. The transparent conductive layer according to claim 1, wherein the particles generated during conversion remain at the same position at which the nanowires have been.

9. A patterned transparent conductive film, comprising:
    a substrate, and
    a conductive layer according to claim 1 on the substrate.

10. The patterned transparent conductive film according to claim 9, wherein the substrate is optically transparent.

11. The patterned transparent conductive film according to claim 9, wherein the substrate is made of glass, polycarbonate, polyethylene terephthalate, cyclic olefin polymer, polyimide, or polymethyl methacrylate.

12. A process for producing a patterned transparent conductive film according to claim 9, comprising:
    (a) applying of an ink comprising conductive nanoobjects and a binder on a substrate, forming a layer;
    (b) drying the layer;
    (c) patterning the layer by irradiating with a laser, the pattern comprising conductive areas and non-conductive areas, wherein in the non-conductive areas the conductive nanoobjects are converted into particles.

13. The process according to claim 12, wherein the ink comprising conductive nanowires and binder is applied by spin coating, draw down coating, roll-to-roll coating, gravure printing, microgravure printing, screen-printing, flexo-printing and slot-die coating.

14. The process according to claim 12, wherein the ink applied to the substrate comprises 0.01 to 1 wt % electrically conductive nanoobjects, 0.02 to 5 wt % binder and solvent.

15. The process according to claim 14, wherein the solvent is at least one selected from the group consisting of water, alcohols, ketones, ethers, hydrocarbons and aromatic solvents.

16. The process according to claim 12, wherein the drying of the layer is carried out at a temperature in the range from 20 to 200° C. for 0.5 to 30 min.

17. The process according to claim 12, wherein the drying of the layer is carried out in an atmosphere comprising air, nitrogen or argon.

18. The process according to claim 12, wherein the binder is selected from the group consisting of hydropropyl methyl cellulose, crystalline cellulose, poly(meth)acrylates, copolymers of acrylates and methacrylates, copolymers of styrene and (meth)acrylates, carboxymethyl cellulose, poly acrylamide, polyvinylalcohol, polyvinylpyrrolidone, polystyrenesulfonic acid, dextran and mixtures thereof.

* * * * *

UNITED STATES PATENT AND TRADEMARK OFFICE
CERTIFICATE OF CORRECTION

PATENT NO. : 10,201,082 B2
APPLICATION NO. : 15/513066
DATED : February 5, 2019
INVENTOR(S) : Rui Zhang et al.

It is certified that error appears in the above-identified patent and that said Letters Patent is hereby corrected as shown below:

In the Specification

In Column 1, Line 20, "ore" should read -- or --.

In Column 3, Line 48, "angle)" should read -- angle --.

In Column 4, Line 46, "copolyers" should read -- copolymers --.

In Column 5, Line 17, "copolyers" should read -- copolymers --.

In Column 5, Line 31, "ore" should read -- or --.

In Column 9, Line 45, Table 2.1, "Rsh before" should read -- $R_{sh}$ before --.

In Column 9, Line 45, Table 2.1, "Rsh after" should read -- $R_{sh}$ after --.

In Column 9, Line 59, "and and" should read -- and --.

Signed and Sealed this
Twenty-first Day of April, 2020

Andrei Iancu
*Director of the United States Patent and Trademark Office*